(12) United States Patent
Sato

(10) Patent No.: US 12,323,013 B2
(45) Date of Patent: Jun. 3, 2025

(54) MOTOR CONTROL DEVICE

(71) Applicant: JTEKT CORPORATION, Kariya (JP)

(72) Inventor: Yuto Sato, Okazaki (JP)

(73) Assignee: JTEKT CORPORATION, Kariya (JP)

( * ) Notice: Subject to any disclaimer, the term of this patent is extended or adjusted under 35 U.S.C. 154(b) by 170 days.

(21) Appl. No.: 18/269,995

(22) PCT Filed: Feb. 19, 2021

(86) PCT No.: PCT/JP2021/006416
§ 371 (c)(1),
(2) Date: Jun. 28, 2023

(87) PCT Pub. No.: WO2022/176166
PCT Pub. Date: Aug. 25, 2022

(65) Prior Publication Data
US 2024/0072617 A1    Feb. 29, 2024

(51) Int. Cl.
*H02K 11/33*    (2016.01)

(52) U.S. Cl.
CPC ......... *H02K 11/33* (2016.01); *H02K 2203/03* (2013.01); *H02K 2211/03* (2013.01)

(58) Field of Classification Search
CPC ............... H02K 11/33; H02K 2203/03; H02K 2211/03; H02K 11/215; H02K 2203/09; H05K 1/0228; H05K 2201/1009; H05K 2201/10151; B62D 5/0406; B62D 15/0235; H02P 25/22; H02P 27/06
See application file for complete search history.

(56) References Cited

U.S. PATENT DOCUMENTS

| | | | |
|---|---|---|---|
| 6,577,030 B2 * | 6/2003 | Tominaga | H02K 11/33 310/68 B |
| 10,328,972 B2 * | 6/2019 | Fujita | G01D 5/14 |
| 10,759,467 B2 | 9/2020 | Sonoda et al. | |

(Continued)

FOREIGN PATENT DOCUMENTS

| | | |
|---|---|---|
| JP | 2017-143203 A | 8/2017 |
| JP | 2019-80471 A | 5/2019 |

(Continued)

OTHER PUBLICATIONS

Mar. 7, 2024 Extended Search Report issued in European Patent Application No. 21926599.8.

(Continued)

*Primary Examiner* — Mohamad A Musleh
(74) *Attorney, Agent, or Firm* — Oliff PLC

(57) ABSTRACT

A motor control device controls a motor including winding groups of two systems. The motor control device includes a board and sensors provided on the board and configured to generate electric signals based on rotation of the motor. The board includes a first area and a second area defined across a boundary line. The first area and the second area include power circuit areas, control circuit areas, signal paths through which the electric signals are transmitted to the control circuit areas, and power paths through which electric power supplied from a power supply is transmitted to the power circuit areas, respectively. The signal paths are provided not to cross the power paths and the power circuit areas when viewed in an axial direction of the motor, respectively.

8 Claims, 5 Drawing Sheets

(56) References Cited

U.S. PATENT DOCUMENTS

| | | |
|---|---|---|
| 2019/0052154 A1 | 2/2019 | Sugiura |
| 2019/0126972 A1 | 5/2019 | Okamura et al. |
| 2019/0310150 A1 | 10/2019 | Horiba et al. |
| 2020/0180685 A1 | 6/2020 | Suzuki et al. |
| 2020/0366166 A1 | 11/2020 | Kurihara et al. |
| 2021/0009192 A1 | 1/2021 | Yamasaki |

FOREIGN PATENT DOCUMENTS

| | | | | |
|---|---|---|---|---|
| JP | 2019-187078 A | 10/2019 | | |
| JP | 2020-92583 A | 6/2020 | | |
| JP | 2020188658 A | * 11/2020 | ........... | B62D 5/0403 |
| WO | 2017/199304 A1 | 11/2017 | | |

OTHER PUBLICATIONS

Apr. 10, 2021 International Search Report issued in International Patent Application No. PCT/JP2021/006416.

* cited by examiner

MOTOR CONTROL DEVICE

TECHNICAL FIELD

The present disclosure relates to a motor control device.

BACKGROUND ART

Conventionally, there is a motor including two power supply systems as described in, for example, Patent Document 1. The motor includes two winding groups each having three phases. A control device for this motor individually controls power supply to the two winding groups. The control device for the motor includes a single board, two inverters, a single rotation angle sensor, and two control units. The inverters, the rotation angle sensor, and the control units are provided on the board.

The inverter converts direct current power supplied from a power supply into three-phase alternating current power. The rotation angle sensor includes two detection circuits. These detection circuits each detect a rotation angle of the motor. Each control unit includes a microcomputer. Each microcomputer controls the inverter of a corresponding one of the two power supply systems based on the rotation angle of the motor detected by the detection circuit of the corresponding system. Thus, three-phase alternating current power is individually supplied to the two winding groups.

Power-related electronic components including the inverters of the individual systems and control-related electronic components including the rotation angle sensor and the microcomputers are regularly disposed on the board. The rotation angle sensor is provided near the center of the board when viewed in an axial direction of the motor. The power-related electronic components and the control-related electronic components of the individual systems are provided line-symmetrically across a symmetry axis that is a straight line passing through the center of the board when viewed in the axial direction of the motor.

RELATED ART DOCUMENTS

Patent Documents
  Patent Document 1: Japanese Unexamined Patent Application Publication No. 2020-92583 (JP 2020-92583 A)

SUMMARY OF THE INVENTION

Problem to be Solved by the Invention

In the conventional control device for the motor including the control device of Patent Document 1, the board has signal lines and power lines. The signal line is a wire for transmitting an electric signal. The power line is a wire for transmitting electric power. An electric signal generated, for example, by the rotation angle sensor is transmitted to the microcomputer via the signal line. Electric power from the power supply is transmitted to the inverter via the power line. A current having a larger value flows through the power line compared with the signal line. Therefore, noise may be superimposed on the electric signal due to influence of a magnetic field generated from, for example, the power line depending on the layout of the electronic components and the wires on the board.

Means for Solving the Problem

A motor control device according to an aspect of the present disclosure is a motor control device configured to control a motor including winding groups of two systems. The motor control device includes a board provided side by side with the motor in an axial direction of the motor, and a sensor provided on the board and configured to generate an electric signal based on rotation of the motor. The board includes a first area and a second area defined across a boundary line that passes through a center of the motor and is orthogonal to an axis of the motor when viewed in the axial direction of the motor. Each of the first area and the second area includes a power circuit area for converting electric power supplied from an external power supply into electric power to be supplied to the winding group of a corresponding system out of the two systems, a control circuit area for controlling power supply to the winding group of the corresponding system out of the two systems based on the electric signal generated by the sensor, a signal path through which the electric signal is transmitted to the control circuit area, and a power path through which the electric power supplied from the power supply is transmitted to the power circuit area. In each of the first area and the second area, the signal path is provided not to cross the power path and the power circuit area when viewed in the axial direction of the motor.

MODES FOR CARRYING OUT THE INVENTION

First Embodiment

A first embodiment in which a motor control device is embodied in a motor device will be described below.

Figure 1:
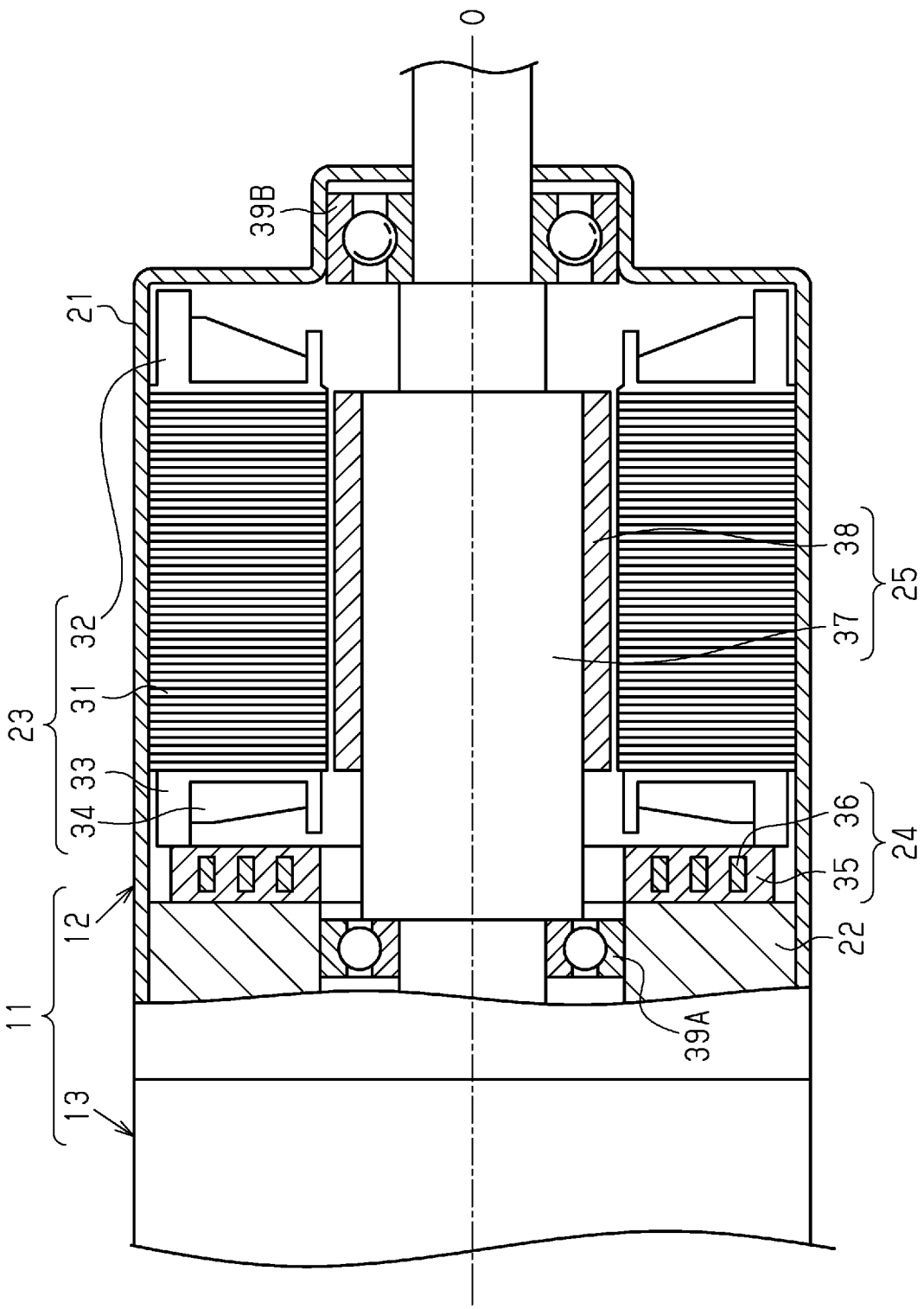
FIG. 1 is a partial sectional view of a motor device including a motor control device of a first embodiment.

As shown in FIG. 1, a motor device 11 includes a motor 12 and a control device 13. For example, a three-phase brushless motor is employed as the motor 12. The motor 12 includes winding groups of two systems. The control device 13 is provided at the axial end of the motor 12. The control device 13 independently controls power supply to the winding groups of the two systems in the motor 12 for the individual systems. The control device 13 corresponds to the motor control device.

The motor 12 includes a cylindrical case 21 closed at one end, and a lid 22 that closes the opening of the case 21. A stator 23, a busbar module 24, and a rotor 25 are provided in the case 21.

The stator 23 is fixed while being fitted to the inner peripheral surface of the case 21. The stator 23 includes a cylindrical core 31, two insulators 32, 33, and a plurality of windings 34. The insulator 32 is provided at a first end of the core 31 and the insulator 33 is provided at a second end of the core 31. The plurality of windings 34 is wound around the core 31 via the insulators 32, 33. The plurality of windings 34 constitutes a first winding group and a second winding group.

The busbar module 24 is provided at the end of the stator 23 so that it is positioned between the lid 22 and the stator 23. The busbar module 24 includes a cylindrical holder 35 and a plurality of busbars 36. The holder 35 is made of a synthetic resin. The shape of the holder 35 is cylindrical. Each busbar 36 is held by the holder 35. The end of a corresponding winding 34 is connected to each busbar 36 as appropriate. Three-phase alternating current power is supplied to each winding 34 via a corresponding busbar 36.

The rotor 25 is inserted through the inner peripheries of the stator 23 and the busbar module 24. The rotor 25 includes a stepped columnar rotation shaft 37 and a cylindrical rotor magnet 38 fixed to the outer peripheral surface of the rotation shaft 37. The rotation shaft 37 is rotatably supported via two bearings 39A, 39B provided in the inner bottom of the case 21 and in the lid 22. A first end of the rotation shaft 37 protrudes to the outside through the bottom wall of the case 21. A second end of the rotation shaft 37 extends toward the control device 13.

Figure 2:
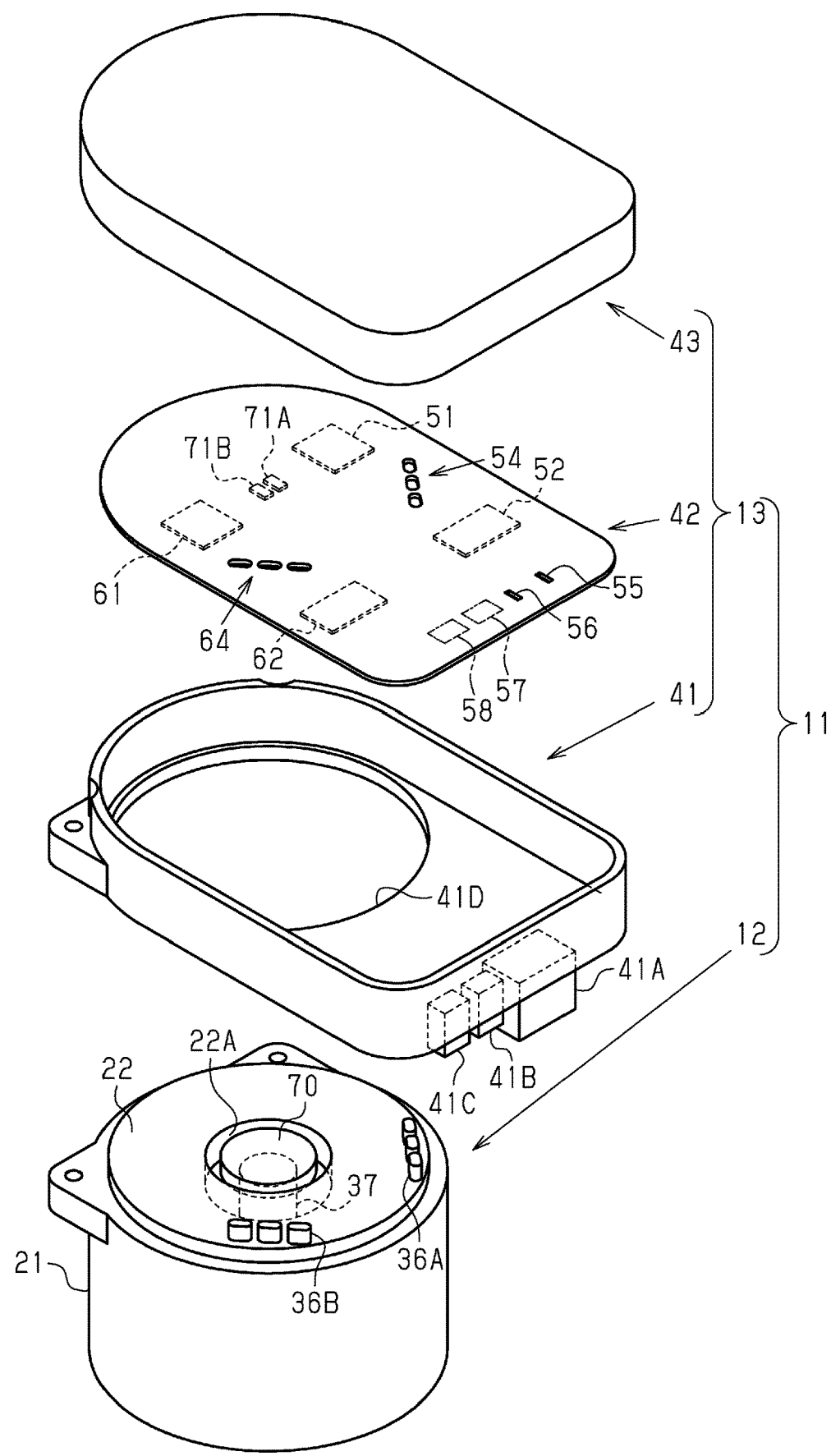
FIG. 2 is an exploded perspective view of the motor control device of FIG. 1.

As shown in FIG. 2, the lid 22 projects slightly outward from the open end of the case 21. Three motor terminals 36A associated with the first winding group of the motor 12 and three motor terminals 36B associated with the second winding group of the motor 12 protrude to the outside of the case 21 from the outer end surface of the lid 22. These motor terminals 36A, 36B are a part of the three-phase busbars 36. The motor terminals 36A, 36B, that is, the ends of the busbars 36 are led out of the motor 12 through the lid 22 in a non-contact manner. The lid 22 is made of a metal such as aluminum having excellent thermal conductivity. The shape of the lid 22 is columnar. The lid 22 is used as a bearing holder that holds the bearing 39A. Further, the lid 22 is used as a heat sink for facilitating heat dissipation.

The three motor terminals 36A and the three motor terminals 36B are provided on the peripheral portion of the lid 22. The three motor terminals 36A and the three motor terminals 36B are provided apart from each other in a circumferential direction of the lid 22. The three motor terminals 36A are arranged in a row along a tangential direction to the outer periphery of the lid 22 at a position where the central motor terminal 36A is provided when viewed in an axial direction of the motor 12. Similarly, the three motor terminals 36B are arranged in a row along a tangential direction to the outer periphery of the lid 22 at a position where the central motor terminal 36B is provided when viewed in the axial direction of the motor 12.

The lid 22 has a housing hole 22A. The housing hole 22A is provided at the center of the lid 22 when viewed in the axial direction of the motor 12. The housing hole 22A extends through the lid 22 in the axial direction of the motor 12. The end of the rotation shaft 37 of the motor 12 is inserted into the housing hole 22A. A columnar permanent magnet 70 is fixed to the end of the rotation shaft 37. The outside diameter of the permanent magnet 70 is set smaller than the bore diameter of the housing hole 22A. The permanent magnet 70 is a so-called dipole magnet. The permanent magnet 70 is magnetized to a north pole at a half and to a south pole at the other half across a straight line along the diameter of the permanent magnet 70. The permanent magnet 70 is housed in the housing hole 22A. The permanent magnet 70 is positioned on an inner side of the outer end surface of the lid 22 in the axial direction of the motor 12. That is, the permanent magnet 70 does not protrude to the outside from the outer end surface of the lid 22 in the axial direction of the motor 12.

Next, the configuration of the control device 13 will be described.

As shown in FIG. 2, the control device 13 includes a housing 41, a board 42, and a cover 43.

The housing 41 is fixed to the axial end of the motor 12, and more specifically, to the open end of the case 21. The housing 41 is made of a metal such as aluminum having excellent thermal conductivity. The housing 41 is used as a heat sink for facilitating heat dissipation. The shape of the housing 41 is a box shape with one open end. The opening of the housing 41 is oriented opposite to the motor 12 (upward in FIG. 2). The housing 41 has a portion that overlaps the motor 12 and a portion that projects laterally to the motor 12 when viewed in the axial direction of the motor 12.

The housing 41 has a fitting hole 41D. The fitting hole 41D is provided at a portion of the bottom wall of the housing 41 mating with the motor 12. The fitting hole 41D extends through the bottom wall of the housing 41 in the axial direction of the motor 12. The bore diameter of the fitting hole 41D is set slightly larger than the outside diameter of the lid 22 of the motor 12. The fitting hole 41D can be fitted to a portion of the lid 22 that projects outward from the end of the case 21.

The housing 41 includes four side walls constituting its outer periphery. These side walls include two long side walls facing each other in a short side direction and two short side walls facing each other in a long side direction when viewed in the axial direction of the motor 12. Of the two short side walls, the short side wall closer to the fitting hole 41D is curved in an arc shape along the outer periphery of the motor 12.

The housing 41 includes three connector fitting portions 41A, 41B, 41C. The three connector fitting portions 41A, 41B, 41C are provided on the bottom surface of the portion of the housing 41 that projects laterally to the motor 12. The shape of each of the three connector fitting portions 41A, 41B, 41C is a square tubular shape. The connector fitting portion 41A is larger in size than the other two connector fitting portions 41B, 41C. The sizes of the two connector fitting portions 41B, 41C are approximately the same. The three connector fitting portions 41A, 41B, 41C are arranged in a row along the flat plate-shaped short side wall of the housing 41 that faces the arc-shaped short side wall in the long side direction. The connector fitting portions 41A, 41B, 41C are open opposite to the opening direction of the housing 41 (downward in FIG. 2).

A plug connector of a wire extending from a direct current power supply such as a battery is fitted to the connector fitting portion 41A. A power terminal and a ground terminal (not shown) are provided inside the connector fitting portion 41A. The power terminal and the ground terminal are connected to the board 42.

Plug connectors of wires extending from devices external to the motor device 11 are fitted to the two connector fitting portions 41B, 41C. Examples of the external devices include sensors that detect physical quantities to be used for controlling the motor 12, and other control devices that exchange information with the control device 13. Signal terminals (not shown) are provided inside the two connector fitting portions 41B, 41C. The signal terminals are connected to the board 42.

The board 42 is housed in the housing 41. That is, the board 42 is provided side by side with the motor 12 in the axial direction of the motor 12. The thickness direction of the board 42 is parallel to the axial direction of the motor 12. When viewed in the axial direction of the motor 12, the contour of the outer periphery of the board 42 conforms to the contour shape of the inner periphery of the housing 41. The board 42 has such a shape that one short side of a rectangle has an arc shape when viewed in the axial direction of the motor 12.

The board 42 includes control-related electronic components constituting a control circuit that is a circuit for controlling power supply to the motor 12. The electronic components include two microcomputers 51, 61 associated with the winding groups of the two systems. The two microcomputers 51, 61 are chip-type integrated circuits. The board 42 has a mounting surface that faces the bottom wall of the housing 41. The two microcomputers 51, 61 are provided on the mounting surface of the board 42.

The board 42 includes power-related electronic components constituting a power circuit that is a circuit for supplying electric power to the motor 12. The electronic components include two inverter circuits 52, 62 associated with the winding groups of the two systems. The two inverter circuits 52, 62 are provided on the mounting surface of the board 42.

The board 42 includes two sets of motor terminal connection portions 54, 64, a power terminal connection portion 55, a ground terminal connection portion 56, and two signal terminal connection portions 57, 58. The motor terminal connection portions 54 are portions to which the three motor terminals 36A of the corresponding system are connected. The motor terminal connection portions 64 are portions to which the three motor terminals 36B of the corresponding system are connected. In the illustrated example, these motor terminal connection portions 54, 64 are each three holes, but may be, for example, rectangular parallelepiped terminal blocks. The power terminal connection portion 55 is a portion to which the power terminal of the connector fitting portion 41A is connected. Direct current power from the direct current power supply is supplied to the power terminal connection portion 55 via the power terminal, and a positive voltage is applied thereto. The ground terminal connection portion 56 is a portion to which the ground terminal of the connector fitting portion 41A is connected, and is a portion connected to an anode of the direct current power supply, that is, a ground. The signal terminal connection portion 57 is a portion to which the signal terminal of the connector fitting portion 41B is connected. The signal terminal connection portion 58 is a portion to which the signal terminal of the connector fitting portion 41C is connected. Electric signals are exchanged between the two microcomputers 51, 61 and the devices external to the motor device 11 via the signal terminals.

The board 42 includes two rotation angle sensors 71A, 71B for detecting rotation of the motor 12. The two rotation angle sensors 71A, 71B are provided on the mounting surface of the board 42. The two rotation angle sensors 71A, 71B and the permanent magnet 70 face each other in the axial direction of the motor 12. Magnetic sensors such as MR sensors are employed as the two rotation angle sensors 71A, 71B. A magnetic field from the north pole to the south pole of the permanent magnet 70 is applied to the two rotation angle sensors 71A, 71B. The two rotation angle sensors 71A, 71B generate electric signals based on a direction of the magnetic field generated from the permanent magnet 70, that is, a rotation angle of the rotation shaft 37 of the motor 12.

The cover 43 is attached to the housing 41. The cover 43 is made of, for example, a synthetic resin. The shape of the cover 43 is a box shape with one open end. The cover 43 is open to the housing 41. The cover 43 closes the opening of the housing 41 by being fitted to the outer periphery of the housing 41 to cover the opening.

Next, the electrical configuration of the motor device 11 will be described.

Figure 3:
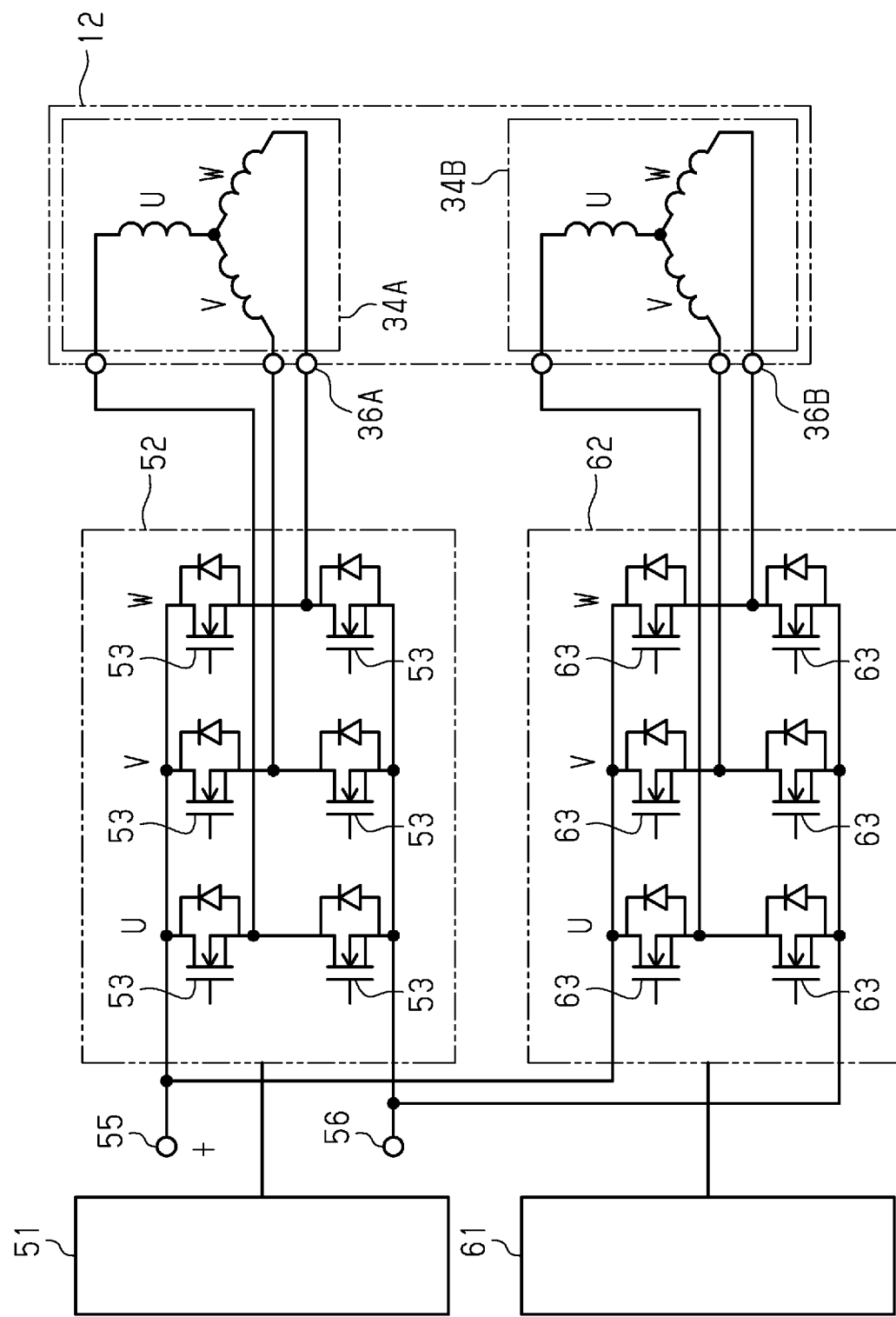
FIG. 3 is a circuit diagram of the motor control device of FIG. 2.

As shown in FIG. 3, the motor device 11 includes a first winding group 34A of the motor 12, the inverter circuit 52, and the microcomputer 51 as components of a first system.

The inverter circuit 52 includes a plurality of FETs (Field Effect Transistors) 53. The inverter circuit 52 includes three legs each being a set of two FETs 53 connected in series. The three legs are connected in parallel between the power terminal connection portion 55 and the ground terminal connection portion 56. The power terminal connection portion 55 and the ground terminal connection portion 56 are connected to a positive terminal and a negative terminal of the direct current power supply, respectively.

The first winding group 34A includes a U-phase winding, a V phase winding, and a W-phase winding. The U-phase winding, the V phase winding, and the W-phase winding are connected by, for example, star connection. The end of each phase winding opposite to a neutral point is connected to a midpoint of the leg of a corresponding phase in the inverter circuit 52 via the motor terminal 36A.

The microcomputer 51 controls operation of the inverter circuit 52. The microcomputer 51 generates a switching command for each FET 53 of the inverter circuit 52 based on the rotation angle of the motor 12 detected through the rotation angle sensor 71A. The FETs 53 of the inverter circuit 52 perform switching based on the switching commands generated by the microcomputer 51 to convert the direct current power supplied from the direct current power supply into three-phase alternating current power. The alternating current power generated by the inverter circuit 52 is supplied to the first winding group 34A of the motor 12 via the motor terminals 36A.

The motor device 11 includes a second winding group 34B of the motor 12, the inverter circuit 62, and the microcomputer 61 as components of a second system.

The inverter circuit 62 includes a plurality of FETs 63. The inverter circuit 62 includes three legs each being a set of two FETs 63 connected in series. The three legs are connected in parallel between the power terminal connection portion 55 and the ground terminal connection portion 56.

The second winding group 34B includes a U-phase winding, a V phase winding, and a W-phase winding. The U-phase winding, the V phase winding, and the W-phase winding are connected by, for example, star connection. The end of each phase winding opposite to a neutral point is connected to a midpoint of the leg of a corresponding phase in the inverter circuit 62 via the motor terminal 36B.

The microcomputer 61 controls operation of the inverter circuit 62. The microcomputer 61 generates a switching command for each FET 63 of the inverter circuit 62 based on the rotation angle of the motor 12 detected through the rotation angle sensor 71B. The FETs 63 of the inverter circuit 62 perform switching based on the switching commands generated by the microcomputer 61 to convert the direct current power supplied from the direct current power supply into three-phase alternating current power. The alternating current power generated by the inverter circuit 62 is supplied to the second winding group 34B of the motor 12 via the motor terminals 36B.

Next, the layout of the components provided on the board 42 will be described.

Figure 4:
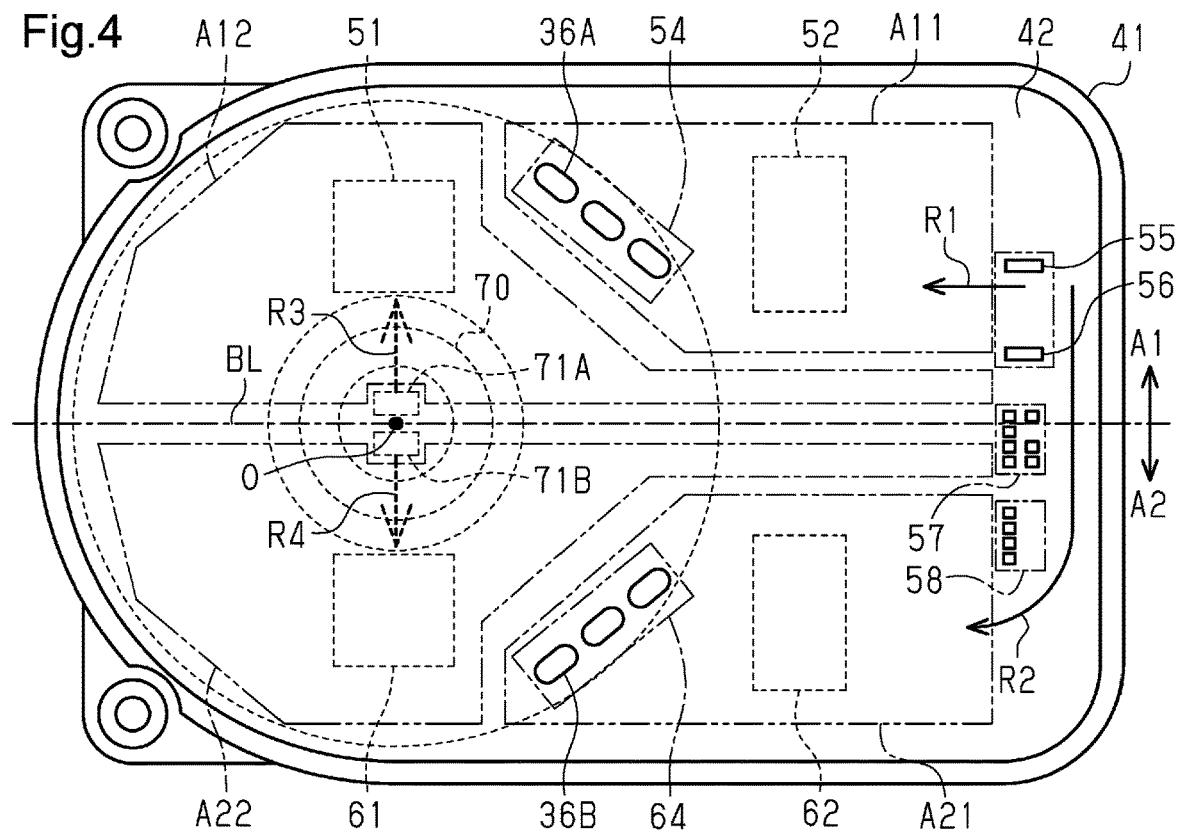
FIG. 4 is a plan view of a board provided in the motor control device of FIG. 2.

As shown in FIG. 4, the board 42 is divided into a first area A1 associated with the winding group of the first system and a second area A2 associated with the winding group of the second system across a boundary line BL. The boundary line BL extends along a long side of the board 42 and passes through an axis O at the center of the motor 12 when viewed in the axial direction of the motor 12. That is, the boundary line BL passes through the center of the motor 12 and is orthogonal to the axis O of the motor 12. The board 42 has a first side and a second side in a direction along the boundary line BL. The first side is a side opposite to the arc-shaped short side of the board 42 (right side in FIG. 4), and the second side is a side where the arc-shaped short side of the board 42 is provided (left side in FIG. 4).

The first area A1 includes a first power circuit area A11 and a first control circuit area A12. The first power circuit area A11 and the first control circuit area A12 are arranged along the boundary line BL when viewed in the axial direction of the motor 12. The first power circuit area A11 is positioned on the first side of the board 42 when viewed in the axial direction of the motor 12. The first control circuit area A12 is positioned on the second side of the board 42 when viewed in the axial direction of the motor 12. Specifically, the first control circuit area A12 includes a first portion that overlaps the motor 12 when viewed in the axial direction of the motor 12, and a second portion that extends from the first portion to the first side of the board 42 along the boundary line BL and is interposed between the first power circuit area A11 and the boundary line BL. The first portion is a body portion positioned farther from the power terminal connection portion 55 than the end of the first power circuit area A11 on the second side in the direction along the boundary line BL. In other words, the first power circuit area A11 is positioned between the body portion of the first control circuit area A12 and the power terminal connection portion 55 in the direction along the boundary line BL.

The second area A2 includes a second power circuit area A21 and a second control circuit area A22. The second power circuit area A21 and the second control circuit area A22 are arranged along the boundary line BL when viewed in the axial direction of the motor 12. The second power circuit area A21 is positioned on the first side of the board 42 when viewed in the axial direction of the motor 12. The second control circuit area A22 is positioned on the second side of the board 42 when viewed in the axial direction of the motor 12. Specifically, the second control circuit area A22 includes a third portion that overlaps the motor 12 when viewed in the axial direction of the motor 12, and a fourth portion that extends from the third portion to the first side of the board 42 along the boundary line BL and is interposed between the second power circuit area A21 and the boundary line BL. The third portion is a body portion positioned farther from the power terminal connection portion 55 than the end of the second power circuit area A21 on the second side in the direction along the boundary line BL. In other words, the second power circuit area A21 is positioned between the body portion of the second control circuit area A22 and the power terminal connection portion 55 in the direction along the boundary line BL.

The first power circuit area A11 and the second power circuit area A21 are line symmetric across a symmetry axis that is the boundary line BL. The first control circuit area A12 and the second control circuit area A22 are line symmetric across a symmetry axis that is the boundary line BL.

The first power circuit area A11 is provided with the power-related electronic components including the inverter circuit 52 that is the component of the first system and the motor terminal connection portions 54. The FETs 53 of the inverter circuit 52 are kept in contact with the bottom wall of the housing 41 via heat dissipation grease. The first control circuit area A12 is provided with control-related electronic circuits including the microcomputer 51 that is the component of the first system.

The second power circuit area A21 is provided with the power-related electronic components including the inverter circuit 62 that is the component of the second system and the motor terminal connection portions 64. The FETs 63 of the inverter circuit 62 are kept in contact with the bottom wall of the housing 41 via heat dissipation grease. The second control circuit area A22 is provided with control-related electronic circuits including the microcomputer 61 that is the component of the second system.

The power terminal connection portion 55, the ground terminal connection portion 56, and the two signal terminal connection portions 57, 58 are provided in an end area of the board 42 on the first side when viewed in the axial direction of the motor 12. More specifically, the terminal connection portions (55 to 58) are provided in an area between the short side of the board 42 on the first side and the circuit area group (A11, A12, A21, A22). These terminal connection portions (55 to 58) are arranged in a row along the short side of the board 42 on the first side when viewed in the axial direction of the motor 12.

The power terminal connection portion 55 and the ground terminal connection portion 56 are provided in the first area A1. The power terminal connection portion 55 and the ground terminal connection portion 56 are adjacent to the first power circuit area A11 in the direction along the boundary line BL. The signal terminal connection portion 57 is provided approximately in the second area A2. The signal terminal connection portion 57 slightly projects into the first area A1 across the boundary line BL. The signal terminal connection portion 57 is adjacent to the second control circuit area A22 in the direction along the boundary line BL. The signal terminal connection portion 58 is provided in the second area A2. The signal terminal connection portion 58 is adjacent to the second power circuit area A21 in the direction along the boundary line BL.

The two rotation angle sensors 71A, 71B are provided at portions overlapping the permanent magnet 70 of the board 42 when viewed in the axial direction of the motor 12. That is, the rotation angle sensors 71A, 71B are positioned between the first portion of the first control circuit area A12 and the third portion of the second control circuit area A22. The two rotation angle sensors 71A, 71B are provided on the board 42 at positions line symmetric across a symmetry axis that is the boundary line BL. The rotation angle sensor 71A is provided near the boundary line BL in the first area A1 and adjacent to the first control circuit area A12. The rotation angle sensor 71B is provided near the boundary line BL in the second area A2 and adjacent to the second control circuit area A22.

Electric power supplied to the board 42 via a pair of the power terminal connection portion 55 and the ground terminal connection portion 56 is supplied to the four circuit areas (A11, A12, A21, A22) of the board 42 via power lines. Electric signals from the two signal terminal connection portions 57, 58 are supplied to the first control circuit area A12 and the second control circuit area A22 of the board 42 via signal lines. An electric signal generated by the rotation angle sensor 71A is supplied to the first control circuit area A12 via a signal line. An electric signal generated by the rotation angle sensor 71B is supplied to the second control circuit area A22 via a signal line.

The power lines and the signal lines are provided as pattern wiring on the board 42. For example, a multilayer board is employed as the board 42. The multilayer board is a board in which a plurality of insulating layers and a plurality of wiring layers are alternately laminated. For example, a six-layer board includes a total of six wiring layers including two layers provided on two surfaces of the board positioned opposite to each other, and four layers provided inside the board. The wiring layer is formed into a predetermined pattern shape by, for example, removing a part of conductor foil by etching. Each of the plurality of wiring layers is used as at least one of the power line and the signal line. The plurality of determined wiring layers are connected by, for example, vias.

Next, an example of paths of the power lines and the signal lines on the board 42 will be described. The board 42 is viewed in the axial direction of the motor 12.

As shown in FIG. 4, the electric power from the pair of the power terminal connection portion 55 and the ground terminal connection portion 56 is supplied to the first power circuit area A11 through a first path R1 that is a power path. The first path R1 extends linearly toward the first power circuit area A11 in the direction along the boundary line BL from the portion of the board 42 where the power terminal connection portion 55 and the ground terminal connection portion 56 are provided.

The electric power from the pair of the power terminal connection portion 55 and the ground terminal connection portion 56 is supplied to the second power circuit area A21 through a second path R2 that is a power path. The second path R2 extends toward the second area A2 in a direction intersecting the boundary line BL from the portion of the board 42 where the power terminal connection portion 55 and the ground terminal connection portion 56 are provided. The second path R2 detours along an outer side of the two signal terminal connection portions 57, 58 on the board 42 and reaches the second power circuit area A21. The outer side is a side opposite to the circuit areas (A11, A12, A21, A22) with respect to the two signal terminal connection portions 57, 58 on the board 42 in the direction along the boundary line BL.

The electric signal generated by the rotation angle sensor 71A is supplied to the first control circuit area A12 through a third path R3 that is a signal path. The third path R3 extends linearly from the rotation angle sensor 71A to a side opposite to the second control circuit area A22 in a direction intersecting the boundary line BL.

The electric signal generated by the rotation angle sensor 71B is supplied to the second control circuit area A22 through a fourth path R4 that is a signal path. The fourth path R4 extends linearly from the rotation angle sensor 71B to a side opposite to the first control circuit area A12 in a direction intersecting the boundary line BL.

Effects of First Embodiment

Therefore, according to the first embodiment, the following effects can be obtained.

(1) Both the first path R1 that is the path of the current to be supplied to the first power circuit area A11 and the second path R2 that is the path of the current to be supplied to the second power circuit area A21 are provided to bypass the two signal terminal connection portions 57, 58. Therefore, the two signal terminal connection portions 57, 58 are less susceptible to magnetic fields caused by large currents flowing through the first path R1 and the second path R2. Thus, it is possible to suppress superimposition of noise on the electric signals from the two signal terminal connection portions 57, 58.

(2) The rotation angle sensor 71A is adjacent to the first control circuit area A12. Therefore, the third path R3 that is the path of the electric signal to be transmitted from the rotation angle sensor 71A to the first control circuit area A12 can be set without crossing the first power circuit area A11 and the first path R1. Thus, the rotation angle sensor 71A and the third path R3 are less susceptible to the magnetic field caused by the large current flowing through the first power circuit area A11 and the first path R1. Accordingly, it is possible to suppress superimposition of noise on the electric signal generated by the rotation angle sensor 71A and the electric signal transmitted through the third path R3.

The rotation angle sensor 71B is adjacent to the second control circuit area A22. Therefore, the fourth path R4 that is the path of the electric signal to be transmitted from the rotation angle sensor 71B to the second control circuit area A22 can be set without crossing the second power circuit area A21 and the second path R2. Thus, the rotation angle sensor 71B and the fourth path R4 are less susceptible to the magnetic field caused by the large current flowing through the second power circuit area A21 and the second path R2. Accordingly, it is possible to suppress superimposition of noise on the electric signal generated by the rotation angle sensor 71B and the electric signal transmitted through the fourth path R4.

(3) The power terminal connection portion 55 and the ground terminal connection portion 56 are provided in the end area of the board 42 on the first side. The first control circuit area A12 and the second control circuit area A22 include the body portions positioned farther from the power terminal connection portion 55 and the ground terminal connection portion 56 than the first power circuit area A11 and the second power circuit area A21 in the direction along the boundary line BL, respectively. Therefore, the distance between each of the power terminal connection portion 55 and the ground terminal connection portion 56 and the first power circuit area A11 can easily be set shorter than the distance between each of the power terminal connection portion 55 and the ground terminal connection portion 56 and the first control circuit area A12. In particular, the power terminal connection portion 55 and the ground terminal connection portion 56 are adjacent to the first power circuit area A11. Therefore, it is possible to appropriately reduce the distance between each of the power terminal connection portion 55 and the ground terminal connection portion 56 and the first power circuit area A11. Further, the distance between each of the power terminal connection portion 55 and the ground terminal connection portion 56 and the second power circuit area A21 can easily be set shorter than the distance between each of the power terminal connection portion 55 and the ground terminal connection portion 56 and the second control circuit area A22. As the distances are reduced, the electrical resistance between each of the power terminal connection portion 55 and the ground terminal connection portion 56 and the first power circuit area A11 and the electrical resistance between each of the power terminal connection portion 55 and the ground terminal connection portion 56 and the second power circuit area A21 are further reduced. Therefore, the electric power is supplied to the motor 12 more appropriately. The output of the motor 12 is also improved.

Second Embodiment

Next, a second embodiment of the motor control device will be described. The present embodiment basically has the same configuration as that of the first embodiment, but is different from the first embodiment in that the power circuit areas and the control circuit areas are set in opposite positions. For convenience of description, the same components are denoted by the same reference numerals as those in the first embodiment and description thereof is omitted.

Figure 5:
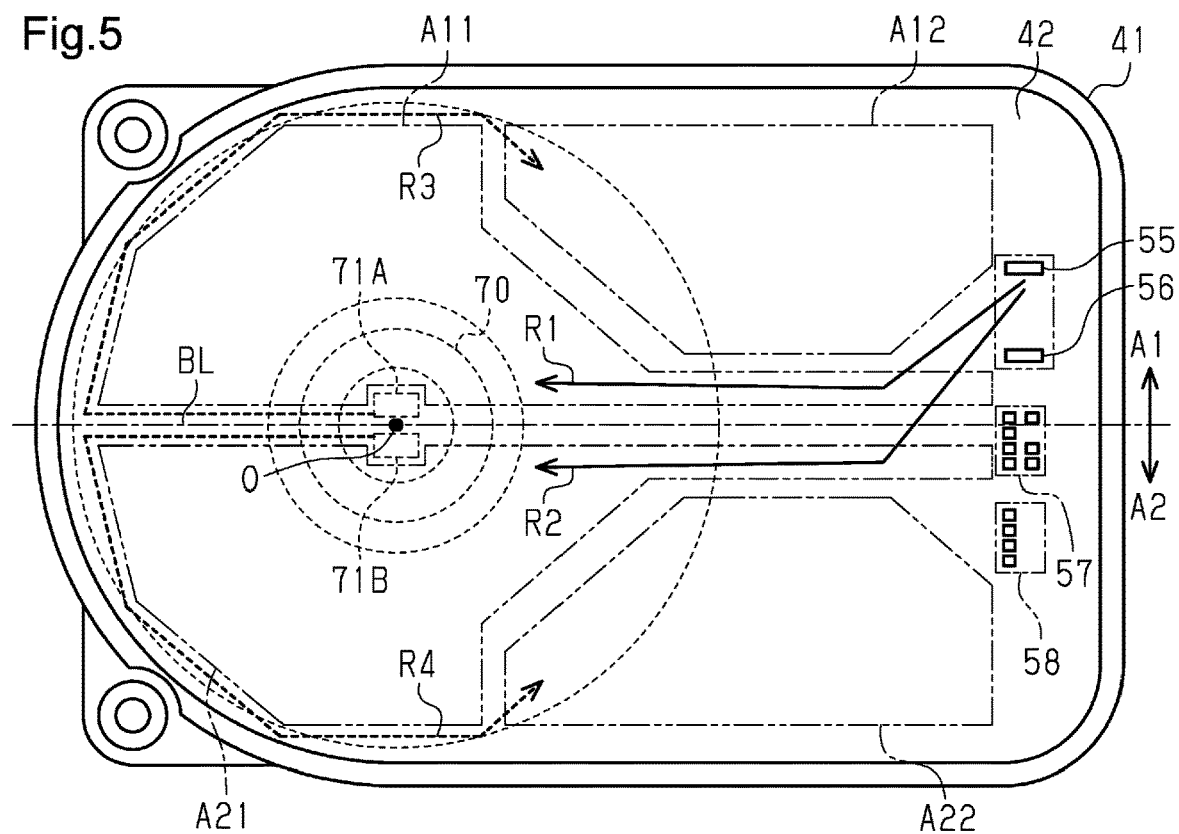
FIG. 5 is a plan view of a board provided in a motor control device of a second embodiment.

As shown in FIG. 5, the first control circuit area A12 is set on the first side (right end side in FIG. 5) in the first area A1 of the board 42. The first power circuit area A11 is set on the second side (left end side in FIG. 5) in the first area A1 of the board 42. The second control circuit area A22 is set on the first side in the second area A2 of the board 42. The second power circuit area A21 is set on the second side in the second area A2 of the board 42. A first portion of the first power circuit area A11 is a body portion positioned farther from the power terminal connection portion 55 than the end of the first control circuit area A12 on the second side in the direction along the boundary line BL. A third portion of the second power circuit area A21 is a body portion positioned farther from the power terminal connection portion 55 than the end of the second control circuit area A22 on the second side in the direction along the boundary line BL. The rotation angle sensors 71A, 71B are positioned between the first portion of the first power circuit area A11 and the third portion of the second power circuit area A21.

The electric power from the pair of the power terminal connection portion 55 and the ground terminal connection portion 56 is supplied to the first power circuit area A11 through the first path R1. The first path R1 extends obliquely toward a portion of the first power circuit area A11 between the first control circuit area A12 and the boundary line BL from the portion of the board 42 where the power terminal connection portion 55 and the ground terminal connection portion 56 are provided when viewed in the axial direction of the motor 12. After the first path R1 extends to the portion between the first control circuit area A12 and the boundary line BL, the first path R1 extends linearly in the portion of the first power circuit area A11 between the first control circuit area A12 and the boundary line BL along the boundary line BL from the first end side toward the second end side of the board 42.

The electric power from the pair of the power terminal connection portion 55 and the ground terminal connection portion 56 is supplied to the second power circuit area A21 through the second path R2. The second path R2 extends obliquely toward a portion of the second power circuit area A21 between the second control circuit area A22 and the boundary line BL from the portion of the board 42 where the power terminal connection portion 55 and the ground terminal connection portion 56 are provided when viewed in the axial direction of the motor 12. After the second path R2 extends to the portion between the second control circuit area A22 and the boundary line BL, the second path R2 extends linearly in the portion of the second power circuit area A21 between the second control circuit area A22 and the boundary line BL along the boundary line BL from the first end side toward the second end side of the board 42.

The electric signal generated by the rotation angle sensor 71A is supplied to the first control circuit area A12 through the third path R3. The third path R3 is provided to detour around the first power circuit area A11. Specifically, the third path R3 extends linearly from the rotation angle sensor 71A to the second side of the board 42 in a portion of the board 42 between the first power circuit area A11 and the boundary line BL. After the third path R3 extends to a position outside the first power circuit area A11 in the direction along the boundary line BL, the third path R3 extends toward the first control circuit area A12 along the peripheral edge of the board 42 on the outer side of the first power circuit area A11.

The electric signal generated by the rotation angle sensor 71B is supplied to the second control circuit area A22 through the fourth path R4. The fourth path R4 is provided to detour around the second power circuit area A21. Specifically, the fourth path R4 extends linearly from the rotation angle sensor 71A to the second side of the board 42 in a portion of the board 42 between the second power circuit area A21 and the boundary line BL. After the fourth path R4 extends to a position outside the second power circuit area A21 in the direction along the boundary line BL, the fourth path R4 extends toward the second control circuit area A22 along the peripheral edge of the board 42 on the outer side of the second power circuit area A21.

[Effects of Second Embodiment]

Therefore, according to the second embodiment, the following effects can be obtained.

(4) The third path R3 that is the path of the electric signal to be transmitted from the rotation angle sensor 71A to the first control circuit area A12 is provided to detour around the first power circuit area A11. Therefore, the third path R3 is less susceptible to the magnetic field caused by the large current flowing through the first power circuit area A11. The fourth path R4 that is the path of the electric signal to be transmitted from the rotation angle sensor 71B to the second control circuit area A22 is provided to detour around the second power circuit area A21. Therefore, the fourth path R4 is less susceptible to the magnetic field caused by the large current flowing through the second power circuit area A21. Thus, it is possible to suppress superimposition of noise on the electric signals transmitted through the third path R3 and the fourth path R4.

Third Embodiment

Next, a third embodiment of the motor control device will be described. The present embodiment basically has the same configuration as that of the second embodiment, but is different from the second embodiment in terms of the paths of the electric power to be transmitted from the power terminal connection portion to the power circuit areas and the paths of the electric signals to be transmitted from the rotation angle sensors to the control circuit areas. For convenience of description, the same components are denoted by the same reference numerals as those in the first embodiment and description thereof is omitted.

Figure 6:
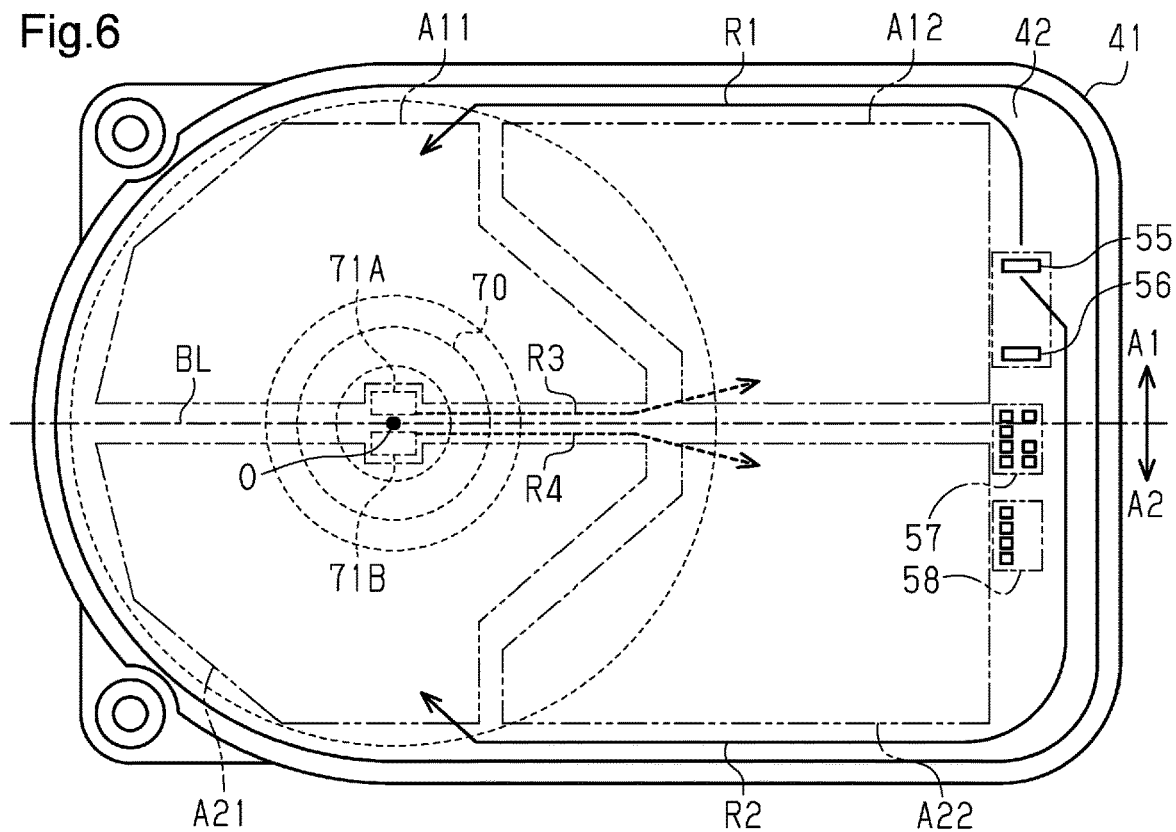
FIG. 6 is a plan view of a board provided in a motor control device of a third embodiment.

As shown in FIG. 6, the first power circuit area A11 does not have the second portion. The first control circuit area A12 extends to a range close to the boundary line BL. The second power circuit area A21 does not have the fourth portion. The second control circuit area A22 extends to a range close to the boundary line BL. The first control circuit area A12 and the second control circuit area A22 are positioned closer to the power terminal connection portion 55 than the first power circuit area A11 and the second power circuit area A21, respectively.

The electric power from the pair of the power terminal connection portion 55 and the ground terminal connection portion 56 is supplied to the first power circuit area A11 through the first path R1. The first path R1 is provided to detour around the first control circuit area A12 when viewed in the axial direction of the motor 12. That is, the first path R1 extends toward the first power circuit area A11 along the peripheral edge of the board 42 on the outer side of the first control circuit area A12 from a start point that is the portion of the board 42 where the power terminal connection portion 55 and the ground terminal connection portion 56 are provided.

The electric power from the pair of the power terminal connection portion 55 and the ground terminal connection portion 56 is supplied to the second power circuit area A21 through the second path R2. The second path R2 is provided to detour around the second control circuit area A22 when viewed in the axial direction of the motor 12. That is, the second path R2 extends toward the second power circuit area A21 along the peripheral edge of the board 42 on the outer side of the second control circuit area A22 from a start point that is the portion of the board 42 where the power terminal connection portion 55 and the ground terminal connection portion 56 are provided.

The electric signal generated by the rotation angle sensor 71A is supplied to the first control circuit area A12 through the third path R3. The third path R3 extends linearly from the rotation angle sensor 71A to the first side of the board 42 in the portion of the board 42 between the first power circuit area A11 and the boundary line BL. After the third path R3 extends to a position outside the first power circuit area A11, the third path R3 extends obliquely toward the first control circuit area A12.

The electric signal generated by the rotation angle sensor 71B is supplied to the second control circuit area A22 through the fourth path R4. The fourth path R4 extends linearly from the rotation angle sensor 71B to the first side of the board 42 in the portion of the board 42 between the second power circuit area A21 and the boundary line BL. After the fourth path R4 extends to a position outside the second power circuit area A21, the fourth path R4 extends obliquely toward the second control circuit area A22.

Effects of Third Embodiment

Therefore, according to the third embodiment, the following effects can be obtained in addition to the effect described in item (1) of the first embodiment.

(5) The third path R3 that is the path of the electric signal to be transmitted from the rotation angle sensor 71A to the first control circuit area A12 is provided not to cross the first power circuit area A11 when viewed in the axial direction of the motor 12. Therefore, the third path R3 is less susceptible to the magnetic field caused by the large current flowing through the first power circuit area A11. The fourth path R4 that is the path of the electric signal to be transmitted from the rotation angle sensor 71B to the second control circuit area A22 is provided not to cross the second power circuit area A21 when viewed in the axial direction of the motor 12. Therefore, the fourth path R4 is less susceptible to the magnetic field caused by the large current flowing through the second power circuit area A21. Thus, it is possible to suppress superimposition of noise on the electric signals transmitted through the third path R3 and the fourth path R4.

(6) The first path R1 that is the path of the electric power to be transmitted from the pair of the power terminal connection portion 55 and the ground terminal connection portion 56 to the first power circuit area A11 is provided to detour along the outer side of the first control circuit area A12. That is, the first path R1 is provided not to cross the first control circuit area A12 when viewed in the axial direction of the motor 12. Therefore, the first control circuit area A12 is less susceptible to the magnetic field caused by the large current flowing through the first path R1. The second path R2 that is the path of the electric power to be transmitted from the pair of the power terminal connection portion 55 and the ground terminal connection portion 56 to the second power circuit area A21 is provided to detour along the outer side of the second control circuit area A22. That is, the second path R2 is provided not to cross the second control circuit area A22 when viewed in the axial direction of the motor 12. Therefore, the second control circuit area A22 is less susceptible to the magnetic field caused by the large current flowing through the second path R2.

(7) The first path R1 is provided to detour along the outer side of the first control circuit area A12. The second path R2 is provided to detour along the outer side of the second control circuit area A22. Therefore, wider areas can be secured for the first control circuit area A12 and the second control circuit area A22 compared with the case where the first path R1 and the second path R2 are set in the portion of the board 42 between the first control circuit area A12 and the second control circuit area A22 as in the second embodiment shown in FIG. 5.

Fourth Embodiment

Next, a fourth embodiment of the motor control device will be described. The present embodiment basically has the same configuration as that of the first embodiment shown in FIG. 4. For convenience of description, the same components are denoted by the same reference numerals as those in the first embodiment and description thereof is omitted.

Figure 7:
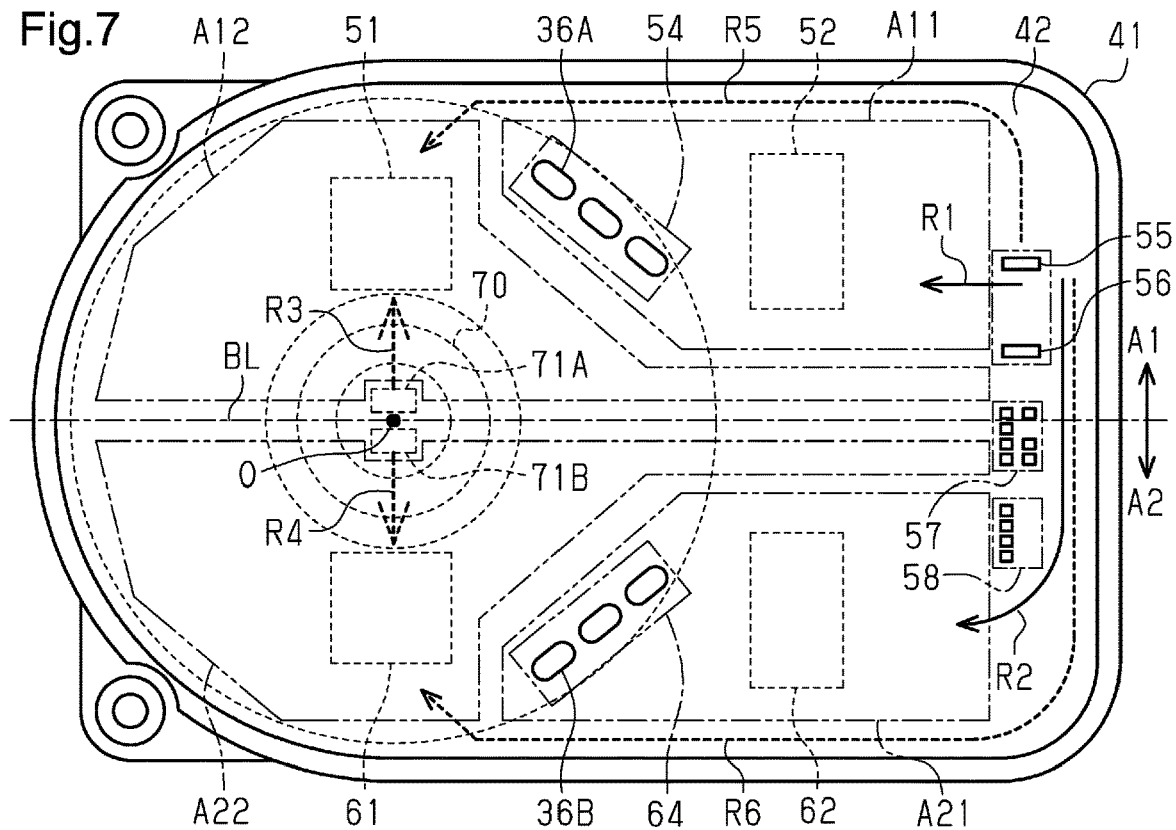
FIG. 7 is a plan view of a board provided in a motor control device of a fourth embodiment.

As shown in FIG. 7, the electric power from the pair of the power terminal connection portion 55 and the ground terminal connection portion 56 is supplied to the first control circuit area A12 through a fifth path R5. The fifth path R5 is provided along the peripheral edge of the board 42 to detour along the outer side of the first power circuit area A11 when viewed in the axial direction of the motor 12.

The electric power from the pair of the power terminal connection portion 55 and the ground terminal connection portion 56 is supplied to the second control circuit area A22 through a sixth path R6. The sixth path R6 is provided along the peripheral edge of the board 42 to detour along the outer side of the ground terminal connection portion 56, the two signal terminal connection portions 57, 58, and the second power circuit area A21 when viewed in the axial direction of the motor 12.

The fifth path R5 and the sixth path R6 may be set in the portion of the board 42 between the first power circuit area A11 and the second power circuit area A21 depending on product specifications.

[Effects of Fourth Embodiment]

Therefore, according to the fourth embodiment, the following effects can be obtained in addition to the effects described in items (1) to (3) of the first embodiment.

(8) The fifth path R5 that is the path of the electric power to be transmitted from the pair of the power terminal connection portion 55 and the ground terminal connection portion 56 to the first control circuit area A12 crosses neither the first power circuit area A11 nor the first path R1 when viewed in the axial direction of the motor 12. Therefore, mutual influence between the magnetic field caused by the current flowing through the fifth path R5 and the magnetic field caused by the current flowing through the first power circuit area A11 is suppressed. Further, mutual influence between the magnetic field caused by the current flowing through the fifth path R5 and the magnetic field caused by the current flowing through the first path R1 is suppressed.

The sixth path R6 that is the path of the electric power to be transmitted from the pair of the power terminal connection portion 55 and the ground terminal connection portion 56 to the second control circuit area A22 crosses neither the second power circuit area A21 nor the second path R2 when viewed in the axial direction of the motor 12. Therefore, mutual influence between the magnetic field caused by the current flowing through the sixth path R6 and the magnetic field caused by the current flowing through the second power circuit area A21 is suppressed. Further, mutual influence between the magnetic field caused by the current flowing through the sixth path R6 and the magnetic field caused by the current flowing through the second path R2 is suppressed.

Other Embodiments

The first to fourth embodiments may be modified as follows.
- Although the two rotation angle sensors 71A, 71B are provided in each embodiment, one rotation angle sensor may be provided. Even in this case, the electric signal generated by the rotation angle sensor is transmitted to the first control circuit area A12 via the third path R3 and is transmitted to the second control circuit area A22 via the fourth path R4.
- The motor device 11 may be used, for example, as a drive source for an electric power steering system. In this case, the motor 12 functions as an assist motor that generates a steering assist force. The control device 13 controls the motor 12 serving as the assist motor.
- The motor device 11 may be used as a drive source for a reaction mechanism or a steering operation mechanism in a steer-by-wire steering system. In this case, the motor 12 functions as a reaction motor that generates a steering reaction force or as a steering operation motor that generates a turning force for turning steered wheels of a vehicle. The control device 13 controls the motor 12 serving as the reaction motor or the steering operation motor.
- Applications of the motor device 11 are not limited to on-board devices. The motor device 11 may be applied as a drive source for a machine tool such as a machining center or for a robot.

The invention claimed is:

1. A motor control device configured to control a motor including winding groups of two systems, the motor control device comprising:
   a board provided side by side with the motor in an axial direction of the motor; and
   a sensor provided on the board and configured to generate an electric signal based on rotation of the motor, wherein
   the board includes a first area and a second area defined across a boundary line that passes through a center of the motor and is orthogonal to an axis of the motor when viewed in the axial direction of the motor,
   each of the first area and the second area includes:
      a power circuit area for converting electric power supplied from an external power supply into electric power to be supplied to the winding group of a corresponding system out of the two systems;
      a control circuit area for controlling power supply to the winding group of the corresponding system out of the two systems based on the electric signal generated by the sensor;
      a signal path through which the electric signal is transmitted to the control circuit area; and
      a power path through which the electric power supplied from the power supply is transmitted to the power circuit area,
   in each of the first area and the second area, the signal path is provided not to cross the power path and the power circuit area when viewed in the axial direction of the motor,
   the board includes, in an end area in a direction along the boundary line, a power terminal connection portion to which the electric power is supplied from the power supply,
   in each of the first area and the second area, the control circuit area includes a body portion arranged along the boundary line together with the power circuit area and positioned farther from the power terminal connection portion than the power circuit area,
   the board includes, in the end area, a signal terminal connection portion for exchanging an electric signal between the control circuit area of each of the first area and the second area and an external device,
   the power terminal connection portion is adjacent to the power circuit area of the first area in the direction along the boundary line,
   the signal terminal connection portion is adjacent to the power circuit area of the second area in the direction along the boundary line,
   the power path through which the electric power is transmitted from the power terminal connection portion to the power circuit area of the first area is provided along the boundary line, and
   the power path through which the electric power is transmitted from the power terminal connection portion to the power circuit area of the second area is provided to detour along an outer side of the signal terminal connection portion.

2. The motor control device according to claim 1, wherein the sensor is positioned between the body portion of the control circuit area of the first area and the body portion of the control circuit area of the second area.

3. The motor control device according to claim 1, further comprising power paths through which the electric power is transmitted from the power terminal connection portion to the control circuit areas of the first area and the second area, the power paths being provided along peripheral edges of the board to detour along outer sides of the power circuit areas of the first area and the second area.

4. A motor control device configured to control a motor including winding groups of two systems, the motor control device comprising:
   a board provided side by side with the motor in an axial direction of the motor; and
   a sensor provided on the board and configured to generate an electric signal based on rotation of the motor, wherein
   the board includes a first area and a second area defined across a boundary line that passes through a center of the motor and is orthogonal to an axis of the motor when viewed in the axial direction of the motor,
   each of the first area and the second area includes:
      a power circuit area for converting electric power supplied from an external power supply into electric power to be supplied to the winding group of a corresponding system out of the two systems;
      a control circuit area for controlling power supply to the winding group of the corresponding system out of the two systems based on the electric signal generated by the sensor;

a signal path through which the electric signal is transmitted to the control circuit area; and a power path through which the electric power supplied from the power supply is transmitted to the power circuit area, in each of the first area and the second area, the signal path is provided not to cross the power path and the power circuit area when viewed in the axial direction of the motor, the board includes, in an end area in a direction along the boundary line, a power terminal connection portion to which the electric power is supplied from the power supply, in each of the first area and the second area, the power circuit area includes a body portion arranged along the boundary line together with the control circuit area and positioned farther from the power terminal connection portion than the control circuit area, the sensor is positioned between the body portion of the power circuit area of the first area and the body portion of the power circuit area of the second area, and in each of the first area and the second area, the signal path is provided along a peripheral edge of the board to detour along an outer side of the power circuit area.

5. The motor control device according to claim 4, wherein the power paths through which the electric power is transmitted from the power terminal connection portion to the power circuit areas of the first area and the second area are provided between the control circuit area of the first area and the control circuit area of the second area.

6. A motor control device configured to control a motor including winding groups of two systems, the motor control device comprising:

a board provided side by side with the motor in an axial direction of the motor; and a sensor provided on the board and configured to generate an electric signal based on rotation of the motor, wherein the board includes a first area and a second area defined across a boundary line that passes through a center of the motor and is orthogonal to an axis of the motor when viewed in the axial direction of the motor, each of the first area and the second area includes:

a power circuit area for converting electric power supplied from an external power supply into electric power to be supplied to the winding group of a corresponding system out of the two systems;

a control circuit area for controlling power supply to the winding group of the corresponding system out of the two systems based on the electric signal generated by the sensor;

a signal path through which the electric signal is transmitted to the control circuit area; and a power path through which the electric power supplied from the power supply is transmitted to the power circuit area, in each of the first area and the second area, the signal path is provided not to cross the power path and the power circuit area when viewed in the axial direction of the motor, the board includes, in an end area in a direction along the boundary line, a power terminal connection portion to which the electric power is supplied from the power supply, in each of the first area and the second area, the control circuit area is arranged along the boundary line together with the power circuit area and positioned closer to the power terminal connection portion than the power circuit area, and the power paths through which the electric power is transmitted from the power terminal connection portion to the power circuit areas of the first area and the second area are provided along peripheral edges of the board to detour along outer sides of the control circuit areas of the first area and the second area.

7. The motor control device according to claim 6, wherein:

the board includes, in the end area, a signal terminal connection portion for exchanging an electric signal between the control circuit area of each of the first area and the second area and an external device;

the power terminal connection portion is adjacent to the control circuit area of the first area in the direction along the boundary line;

the signal terminal connection portion is adjacent to the control circuit area of the second area in the direction along the boundary line;

the power path through which the electric power is transmitted from the power terminal connection portion to the power circuit area of the first area is provided along the peripheral edge of the board to detour along the outer side of the control circuit area of the first area; and the power path through which the electric power is transmitted from the power terminal connection portion to the power circuit area of the second area is provided along the peripheral edge of the board to detour along an outer side of the signal terminal connection portion and the outer side of the control circuit area of the second area.

8. The motor control device according to claim 6, wherein:

the sensor is positioned between the power circuit area of the first area and the power circuit area of the second area; and the signal paths through which the electric signal generated by the sensor is transmitted to the control circuit areas of the first area and the second area are provided between the power circuit area of the first area and the power circuit area of the second area.

* * * * *